(12) United States Patent
Nagasaka et al.

(10) Patent No.: US 10,826,510 B2
(45) Date of Patent: Nov. 3, 2020

(54) ATOMIC OSCILLATOR AND FREQUENCY SIGNAL GENERATION SYSTEM

(71) Applicant: Seiko Epson Corporation, Tokyo (JP)

(72) Inventors: Kimio Nagasaka, Hokuto (JP); Yukihiro Hashi, Shiojiri (JP); Takahiro Kan, Moniwa (JP); Tomohiro Tamura, Matsumoto (JP); Teppei Higuchi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/728,103

(22) Filed: Dec. 27, 2019

(65) Prior Publication Data

US 2020/0212919 A1 Jul. 2, 2020

(30) Foreign Application Priority Data

Dec. 28, 2018 (JP) ................................ 2018-248593

(51) Int. Cl.
*H03L 7/26* (2006.01)
*H03B 17/00* (2006.01)

(52) U.S. Cl.
CPC ............. *H03L 7/26* (2013.01); *H03B 17/00* (2013.01)

(58) Field of Classification Search
CPC .......... G04F 5/14; G04F 5/145; H03B 17/00; H03L 7/26

(Continued)

(56) References Cited

U.S. PATENT DOCUMENTS

| 7,145,403 B2 * | 12/2006 | Matsuura | .................. | H01S 1/06 |
| | | | | 331/94.1 |
| 2009/0302956 A1 * | 12/2009 | Matsuura | ................ | H03L 1/022 |
| | | | | 331/94.1 |

(Continued)

FOREIGN PATENT DOCUMENTS

| JP | H07-007421 A | 1/1995 |
| JP | H10-281883 A | 10/1998 |

(Continued)

OTHER PUBLICATIONS

Kirschvink, Joseph L., "Uniform Magnetic Fields and Double-Wrapped Coil Systems: Improved Techniques for the Design of Bioelectromagnetic Experiments", Division of Geological and Planetary Sciences, California Institute of Technology, Pasadena, CA, Dec. 3, 1990, pp. 401-411.

*Primary Examiner* — Levi Gannon
(74) *Attorney, Agent, or Firm* — Harness, Dickey & Pierce, P.L.C.

(57) ABSTRACT

An atomic oscillator includes: a light-emitting element; an atom cell that includes a first surface on which light beams from the light-emitting element are incident and a second surface from which the light beams incident on the first surface are emitted and accommodates alkali metal atoms in a gas state; a shield that accommodates the atom cell and has a magnetic shielding property, the shield having an opening; a heat transfer member that is in contact with a portion of the atom cell via an opening of the shield and has a thermal conductivity higher than a thermal conductivity of the atom cell; a temperature control element that is in contact with the heat transfer member and controls a temperature of the atom cell; and a light-receiving element that receives the light beams emitted from the second surface.

10 Claims, 9 Drawing Sheets

(58) Field of Classification Search
USPC .................................................. 331/3, 94.1
See application file for complete search history.

(56) References Cited

U.S. PATENT DOCUMENTS

| | | | |
|---|---|---|---|
| 2010/0102893 A1* | 4/2010 | Chindo | ..................... H03L 7/26 |
| | | | 331/94.1 |
| 2015/0180490 A1* | 6/2015 | Chindo | ..................... H03L 7/26 |
| | | | 331/94.1 |
| 2015/0349791 A1 | 12/2015 | Nakajima | |
| 2017/0099060 A1 | 4/2017 | Chindo | |
| 2017/0141783 A1* | 5/2017 | Tanaka | ..................... H03L 1/02 |

FOREIGN PATENT DOCUMENTS

| | | |
|---|---|---|
| JP | 2014-160978 A | 9/2014 |
| JP | 2015-231053 A | 12/2015 |
| JP | 2017-073623 A | 4/2017 |

* cited by examiner

ATOMIC OSCILLATOR AND FREQUENCY SIGNAL GENERATION SYSTEM

The present application is based on, and claims priority from, JP Application Serial Number 2018-248593, filed Dec. 28, 2018, the disclosure of which is hereby incorporated by reference herein in its entirety.

BACKGROUND

1. Technical Field

The present disclosure relates to an atomic oscillator and a frequency signal generation system.

2. Related Art

An atomic oscillator that oscillates based on energy transition of alkali metal atoms such as rubidium atoms or cesium atoms is known. For example, an optical frequency reference cell device described in JP-A-10-281883 is a device which may be used for an atomic oscillator and includes a first cell portion, a second cell portion protruding from the first cell portion, and a heat reserving tube accommodating the entire device except for the second cell portion, and in which alkali metal atoms in a vapor state can freely move between the first cell portion and the second cell portion. Further, the optical frequency reference cell device described in JP-A-10-281883 includes first temperature control means for covering the first cell portion and controlling a temperature of the first cell portion, and second temperature control means for covering the second cell portion and controlling a temperature of the second cell portion. The temperature of the second cell portion is made to be lower than the temperature of the first cell portion, and thus deposition of the metal atoms in a vapor state is first started in the second cell portion. Thereby, it is possible to prevent a metal film from adhering to both end surfaces of the first cell portion.

However, the optical frequency reference cell device described in JP-A-10-281883 has a complicated cell structure since the second cell portion protrudes from the first cell portion. For quality control, it is desirable that the optical frequency reference cell device has a simple cell structure. Therefore, there is a need for an atomic oscillator that has a simpler structure and can control a temperature of a portion of the cell portion to a temperature different from a temperature of the other portion.

SUMMARY

The present disclosure can be implemented as the following application examples.

An atomic oscillator according to an application example includes: a light-emitting element that emits light beams; an atom cell that includes a first surface on which the light beams from the light-emitting element are incident and a second surface from which the light beams incident on the first surface are emitted and accommodates alkali metal atoms in a gas state; a shield that accommodates the atom cell and has a magnetic shielding property; a heat transfer member that is in contact with a portion of the atom cell via an opening of the shield and has a thermal conductivity higher than a thermal conductivity of the atom cell; a temperature control element that is in contact with the heat transfer member and controls a temperature of the atom cell; and a light-receiving element that receives the light beams emitted from the second surface.

A frequency signal generation system according to another application example includes: an atomic oscillator; and a processor that processes a frequency signal from the atomic oscillator, in which the atomic oscillator includes a light-emitting element that emits light beams, an atom cell that includes a first surface on which the light beams from the light-emitting element are incident and a second surface from which the light beams incident on the first surface are emitted and accommodates alkali metal atoms in a gas state, a shield that accommodates the atom cell and has a magnetic shielding property, a heat transfer member that is in contact with a portion of the atom cell via an opening of the shield and has a thermal conductivity higher than a thermal conductivity of the atom cell, a temperature control element that is in contact with the heat transfer member and controls a temperature of the atom cell, and a light-receiving element that receives the light beams emitted from the second surface.

DESCRIPTION OF EXEMPLARY EMBODIMENTS

Hereinafter, an atomic oscillator and a frequency signal generation system according to the present disclosure will be described in detail based on preferred embodiments illustrated in the accompanying drawings. In the following, for convenience of explanation, as illustrated in FIGS. 2 to 6, three axes perpendicular to each other are referred to as an X axis, a Y axis, and a Z axis. In addition, as an example, it is assumed that the X axis is parallel to an optical axis a to be described. Further, a direction indicated by the arrow of each axis is referred to as a "positive direction", and an opposite direction of the direction is referred to as a "negative direction". As an example, it is assumed that the positive direction of the X axis is a traveling direction of light LL.

First Embodiment

Figure 1:
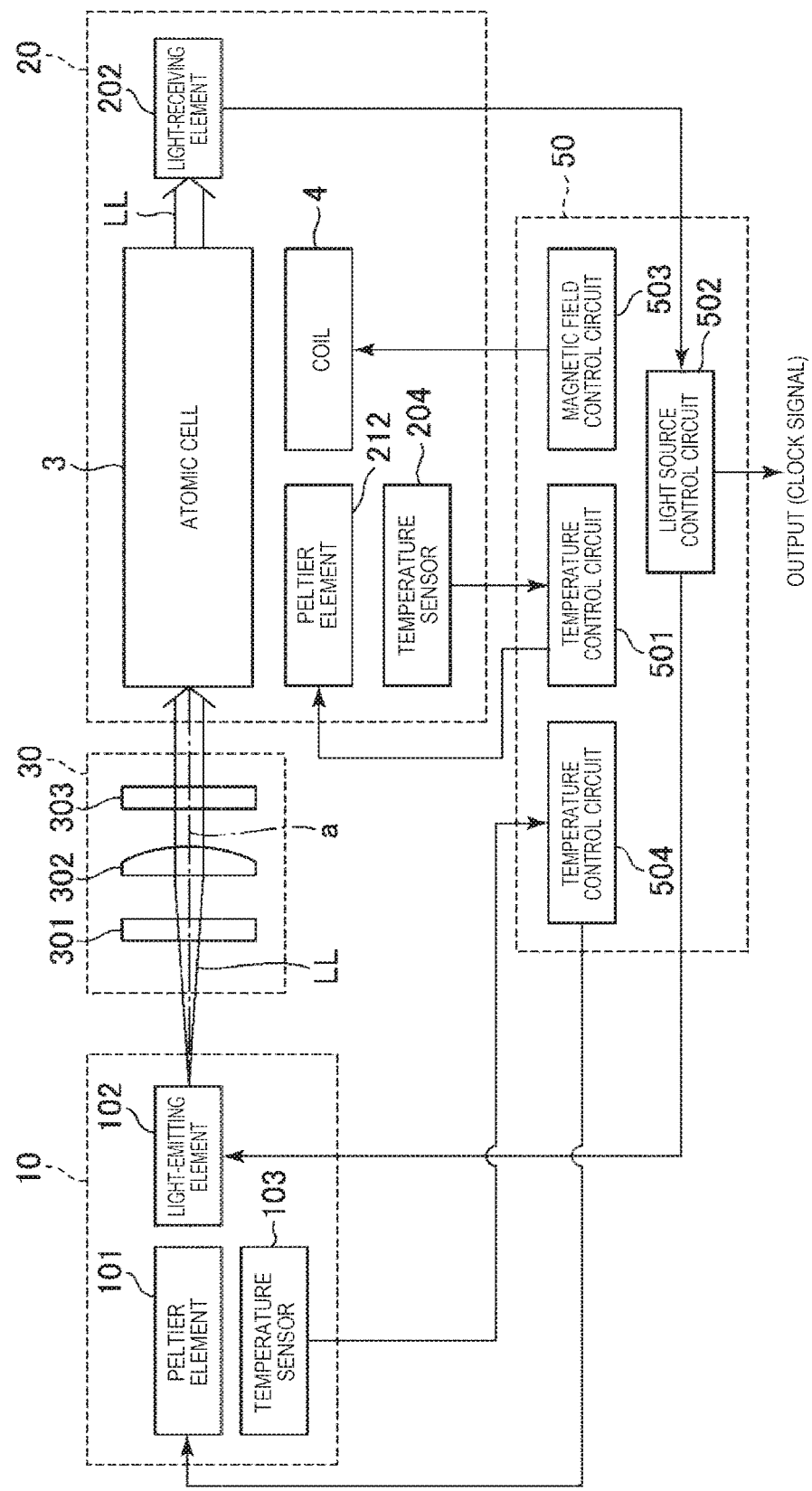
FIG. 1 is a schematic diagram illustrating an atomic oscillator according to a first embodiment.
Figure 2:
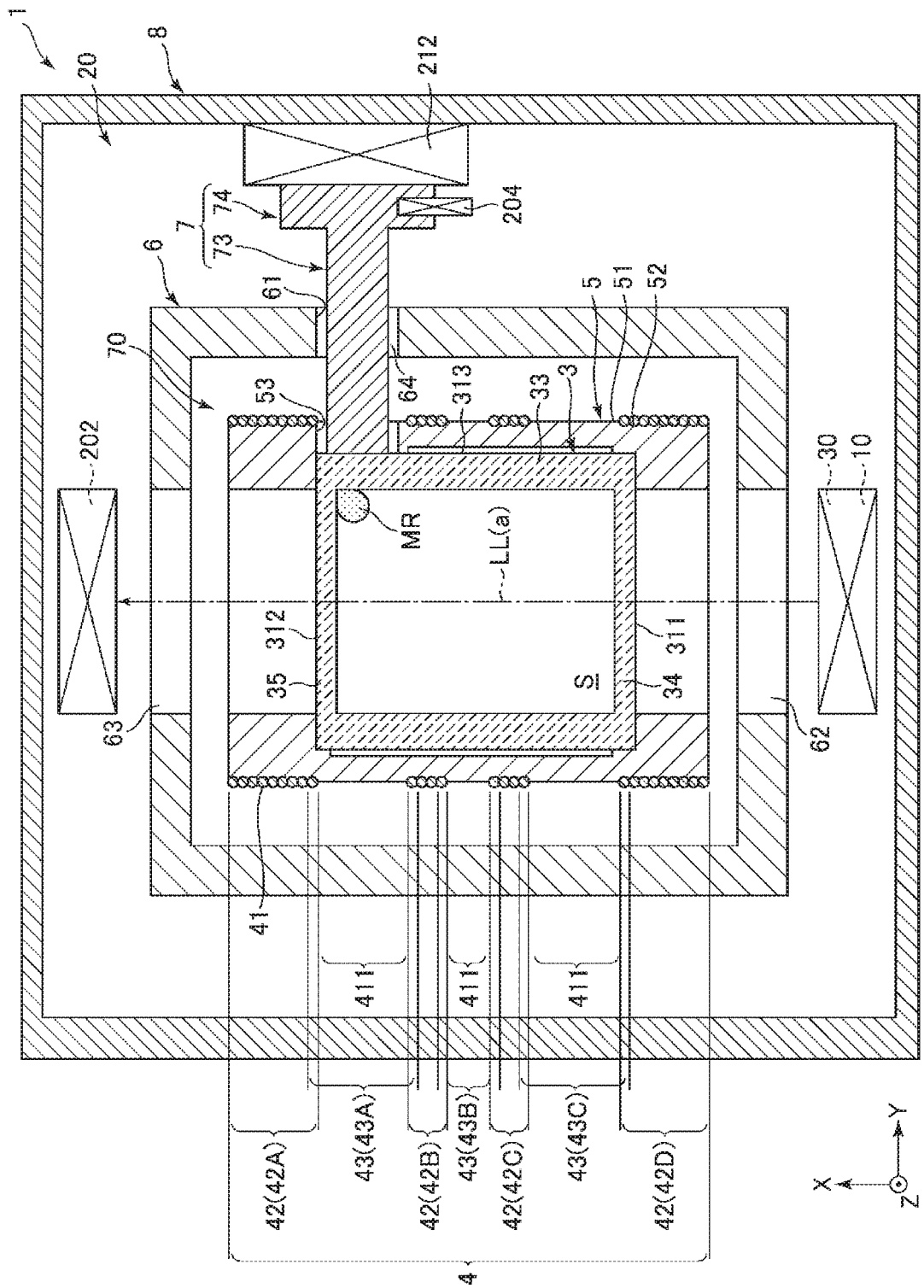
FIG. 2 is a sectional view of a main portion of the atomic oscillator according to the first embodiment.

FIG. 1 is a schematic diagram illustrating an atomic oscillator according to a first embodiment. FIG. 2 is a sectional view of a main portion of the atomic oscillator according to the first embodiment.

The atomic oscillator 1 illustrated in FIG. 1 is an atomic oscillator, which uses a phenomenon in that, when alkali metal atoms are simultaneously irradiated with two resonance light beams having specific different wavelengths, the two resonance light beams are transmitted without being absorbed by alkali metal atoms due to a quantum interference effect. The phenomenon due to the quantum interference effect is referred to as a coherent population trapping (CPT) phenomenon or an electromagnetically induced transparency (EIT) phenomenon.

As illustrated in FIG. 1, the atomic oscillator 1 includes a light-emitting element module 10, an atom cell unit 20, an optical system unit 30 provided between the light-emitting element module 10 and the atom cell unit 20, and a control circuit 50 that controls operations of the light-emitting element module 10 and the atom cell unit 20. Hereinafter, first, an outline of the atomic oscillator 1 will be described.

The light-emitting element module 10 includes a Peltier element 101, a light-emitting element 102, and a temperature sensor 103. The light-emitting element 102 emits linearly-polarized light beams LL including two types of light beams having different frequencies. The light-emitting element 102 is not particularly limited as long as the light-emitting element 102 emits the light beams LL. For example, a semiconductor laser such as a vertical cavity surface emitting laser (VCSEL) may be used. In addition, the temperature sensor 103 detects a temperature of the light-emitting element 102. Further, the Peltier element 101 adjusts the temperature of the light-emitting element 102, that is, heats or cools the light-emitting element 102.

The optical system unit 30 includes a dimming filter 301, a condensing lens 302, and a quarter wave plate 303, which are arranged along the optical axis a of the light beams LL. The dimming filter 301 reduces an intensity of the light beams LL from the light-emitting element 102. In addition, the condensing lens 302 adjusts radiation angles of the light beams LL such that the light beams LL are made close to, for example, parallel light beams. In addition, the quarter wave plate 303 converts the two types of light beams having different frequencies, which are included in the light beams LL, from linearly-polarized light beams to circularly-polarized light beams, that is, right handed circularly-polarized light beams or left handed circularly-polarized light beams.

The atom cell unit 20 includes an atom cell 3, a light-receiving element 202, a Peltier element 212, a temperature sensor 204, and a coil 4.

The atom cell 3 has a property of transmitting the light beams LL, and the atom cell 3 is filled with alkali metal atoms. The alkali metal atom has energy levels of three levels including two different ground levels and an excited level. The light beams LL from the light-emitting element 102 enter the atom cell 3 via the dimming filter 301, the condensing lens 302, and the quarter wave plate 303. The light-receiving element 202 receives the light beams LL transmitting through the atom cell 3, and outputs a signal corresponding to an intensity of the received light beams.

The Peltier element 212 is a temperature control element that controls a temperature of a portion of the atom cell 3. The Peltier element 212 has a function of heating or cooling the portion of the atom cell 3 depending on a direction of the supplied current. Thereby, it is possible to adjust a temperature of the portion of the atom cell 3 to a desired temperature.

In addition, the temperature sensor 204 detects a temperature of a heat transfer member 7.

The coil 4 applies magnetic fields in a predetermined direction to the alkali metal atoms in the atom cell 3 to cause Zeeman splitting of the energy levels of the alkali metal atoms. In such a state where Zeeman splitting of the energy levels of the alkali metal atoms is caused, when the alkali metal atoms are irradiated with the circularly-polarized resonance light pair as described above, in a plurality of the energy levels of the alkali metal atoms of which Zeeman splitting is caused, the number of the alkali metal atoms at a desired energy level can be relatively larger than the number of the alkali metal atoms at other energy levels. Therefore, the number of atoms causing a desired EIT phenomenon increases, and a desired EIT signal, that is, a signal that appears in an output signal of the light-receiving element 202 according to the EIT phenomenon becomes large. As a result, an oscillation characteristic of the atomic oscillator 1, in particular, a short-term frequency stability can be improved.

The control circuit 50 includes a temperature control circuit 501, a light source control circuit 502, a magnetic field control circuit 503, and a temperature control circuit 504. The temperature control circuit 501 controls energization to the Peltier element 212 based on a detection result of the temperature sensor 204 such that the inside of the atom cell 3 becomes a desired temperature. In addition, the magnetic field control circuit 503 controls energization to the coil 4 such that the magnetic fields generated by the coil 4 are constant. Further, the temperature control circuit 504 controls energization to the Peltier element 101 based on a detection result of the temperature sensor 103 such that a temperature of the light-emitting element 102 becomes a desired temperature.

The light source control circuit 502 controls the frequencies of the two types of light beams included in the light LL beams from the light-emitting element 102 based on a detection result of the light-receiving element 202 such that the EIT phenomenon is caused. Here, when the two types of light beams become a resonance light pair having a frequency difference corresponding to an energy difference between the two ground levels of the alkali metal atoms in the atom cell 3, the EIT phenomenon is caused. Further, the light source control circuit 502 includes a voltage controlled crystal oscillator (not illustrated) of which the oscillation frequency is controlled to be stabilized in synchronization with a control of the frequencies of the two types of light beams, and outputs an output signal of the voltage-controlled oscillator (VCO) as an output signal (clock signal) of the atomic oscillator 1.

As above, the outline of the atomic oscillator 1 is described. Hereinafter, a more specific configuration of the atomic oscillator 1 will be described with reference to FIG. 2.

As described above, the atom cell unit 20 includes the atom cell 3, the light-receiving element 202, the Peltier element 212, the temperature sensor 204, and the coil 4. In addition to the components, as illustrated in FIG. 2, the atom cell unit 20 further includes a support member 5 that supports the coil 4, a first shield member 6 that accommodates the atom cell 3, the coil 4, and the support member 5, and a heat transfer member 7 that is in contact with the atom cell 3 and the Peltier element 212. Further, the atomic oscillator 1 includes a second shield member 8 that accommodates the atom cell unit 20, the light-emitting element module 10, and the optical system unit 30.

The atom cell 3 accommodates alkali metal atoms in a gas state and alkali metal atoms in a solid state or a liquid state (hereinafter, referred to as "supplementary metal MR"). The alkali metal is not specifically limited. For example, a rubidium, a cesium, sodium, or the like may be used.

Further, the atom cell 3 may be filled with a rare gas such as argon or neon, or an inert gas such as nitrogen, as a buffer gas, together with the alkali metal atoms in a gas state, when necessary.

The atom cell 3 includes a cylindrical trunk portion 33 which centers on an axis parallel to the X axis, a plate-shaped window portion 34 which is bonded to the trunk portion 33 on the negative X axis, and a plate-shaped window portion 35 which is bonded to the trunk portion 33 on the positive X axis, and an internal space S surrounded by the portions is formed. The light beams LL emitted from the light-emitting element 102 transmit through the window portion 34, the internal space S, and the window portion 35 in order. At this time, the light beams LL can excite the alkali metal atoms in the internal space S. Thereafter, the light beams LL reach the light-receiving element 202. A shape of the internal space S is not particularly limited, and may be, for example, a rectangular parallelepiped shape, a cube shape, a cylinder shape, a sphere shape, or the like. Further, one of the window portions 34 and 35 of the atom cell 3 may be integrated with the trunk portion 33.

In the internal space S, the supplementary metal MR is accommodated. When there is a shortage of alkali metal atoms in a gas state in the internal space S, the supplementary metal MR becomes alkali metal atoms in a gas state, and the alkali metal atoms are excited by the light beams LL. Since the supplementary metal MR is in a solid state or a liquid state in the internal space S, the supplementary metal MR in this state may be attached to a position different from a position of a main path of the light beams LL in the trunk portion 33 and the window portion 35. Thereby, for example, it is possible to prevent the supplementary metal MR from moving in the internal space S and interfering with the light beams LL.

In the atom cell 3, the internal space S may be partitioned into two spaces by a partition portion (not illustrated). In this case, volumes of the two spaces are different from each other, and the supplementary metal MR may be disposed in the space having a smaller volume.

The atom cell 3 has three surfaces as surfaces opposite to surfaces of the internal space S, that is, outer surfaces of the atom cell 3. A first surface is an outer surface of the window portion 34, and is a first surface 311 serving as an incident surface on which the light beams LL from the light-emitting element 102 are incident. A second surface is an outer surface of the window portion 35, and is a second surface 312 serving as an emission surface from which the light beams LL incident on the first surface 311 and transmitting through the internal space S are emitted. A third surface is an outer circumferential surface of the trunk portion 33, and is a third surface 313 connecting the first surface 311 and the second surface 312. In a case where an outer shape of the trunk portion 33 is a prism or the like and includes a plurality of surfaces, the surfaces are collectively referred to as a third surface 313.

A material of the window portion 34 and the window portion 35 is not particularly limited as long as the material has a property of transmitting the light beams LL, and examples of the material include a glass material, crystal, and the like. On the other hand, examples of the material of the trunk portion 33 include quartz glass, borosilicate glass, silicon, crystal, and the like. From a viewpoint of workability and bonding with the window portion 34 and the window portion 35, a glass material or a silicon material may be used. Further, a method of bonding the trunk portion 33 with the window portion 34 and the window portion 35 is determined according to the materials, and is not particularly limited. For example, a direct bonding method, an anode bonding method, a melt bonding method, an optical bonding method, or the like may be used.

On the second surface 312 side of the atom cell 3 configured as described above, the light-receiving element 202 is disposed so as to face the second surface 312. The light-receiving element 202 can detect an intensity of the light LL beams transmitted through the atom cell 3 and emitted from the second surface 312, that is, the resonance light pair. The light-receiving element 202 is not particularly limited, and examples of the light-receiving element 202 include a photodiode.

A cylindrical support member 5 is concentrically disposed with the trunk portion 33 on an outer circumferential side of the trunk portion 33 of the atom cell 3. The support member 5 is a member that supports the atom cell 3 on the inner side and supports the coil 4 on the outer side.

A length between inner walls of the support member 5 along the X axis is longer than the total length of the atom cell 3 along the X axis. Thereby, the entire trunk portion 33 can be accommodated inside the support member 5. Therefore, heat from a heater to be described can be easily transferred to the entire atom cell 3 on the X-axis, and this is a preferable configuration for the atomic oscillator 1.

The coil 4 may be spirally wound around an outer circumferential surface 51 of the support member 5. Thereby, the coil 4 is maintained in a spirally-wound state. In addition, grooves 52 may be spirally formed on the outer circumferential surface 51 of the support member 5 along a circumferential direction of the outer circumferential surface 51. Thereby, when the coil 4 having a spiral shape is formed, the coil 4 can be easily formed by placing one metal wire 41 of the coil 4 along the grooves 52. Further, the grooves 52 can prevent displacement of the coil 4 on the outer circumferential surface 51 of the support member 5, and thus it is possible to more firmly maintain a winding state of the coil 4.

Further, a through hole 53 through which the heat transfer member 7 is inserted is formed on the support member 5. The through hole 53 is an example of an opening of the first shield member 6. Thereby, a position of the heat transfer member 7 can be regulated, and thus the heat transfer member 7 can be easily brought into contact with a desired position of the atom cell 3. In a case where the first shield member 6 includes a container main body and a lid, the heat transfer member 7 may pass through a gap between the container main body and the lid, that is, the opening. Therefore, it is possible to connect the heat transfer member 7 and the atom cell 3 without forming a dedicated through hole for passing the heat transfer member 7 via the first shield member 6.

A material of the support member 5 is not particularly limited. For example, a material that does not hinder the magnetic fields from the coil 4 to the atom cell 3, for example, a nonmagnetic metal material such as aluminum, or a thermally-conductive ceramic material such as silicon carbide may be used. Further, when the coil 4 is formed to generate heat when energized, as the material of the support member 5, a material, which does not hinder the magnetic fields from the coil 4 to the atom cell 3 and has an excellent thermal conductivity, may be used. Thereby, heat generated by the coil 4 can be transmitted to the trunk portion 33 via the support member 5, and thus it is possible to heat the internal space S.

The coil 4 is formed by a wire 41 which is spirally wound outside the atom cell 3 along the third surface 313, particularly, in the present embodiment, as described above, along the outer circumferential surface 51 of the support member 5. The wire 41 of the coil is covered with an insulating material. The coil 4 can generate magnetic fields in a direction along the optical axis a of the light beams LL in the internal space S by energization. The number of the wires 41 of the coil 4 is not limited to one. For example, the coil 4 may be formed by a plurality of wires.

As described above, the atomic oscillator 1 includes the coil 4 that is disposed outside the atom cell 3, is formed by the spirally-wound wire 41, and generates magnetic fields by energization. Thereby, a gap between different degenerated energy levels of the alkali metal atoms in the internal space S can be widened by Zeeman splitting, and thus resolution can be improved. Therefore, it is possible to reduce a line width of the EIT signal. The magnetic fields generated by the coil 4 may be either direct-current magnetic fields or alternating-current magnetic fields, or may be magnetic fields obtained by superimposing direct-current magnetic fields and alternating-current magnetic fields.

The coil 4 includes a plurality of dense winding portions 42 and a plurality of coarse winding portions 43, the dense winding portion 42 being a portion in which the wires 41 adjacent to each other along the X axis, that is, along the optical axis a of the light beams LL transmitting through the atom cell 3 are in contact with each other, and the coarse winding portion 43 being a portion in which a gap 411 is formed between the wires 41 adjacent to each other along the optical axis a, that is, the wires 41 are spaced from each other. As the coil 4, a Helmholtz type coil or a Lee-Whiting type coil may be used. The coil of the present embodiment is a Lee-Whiting type coil in which the dense winding portions 42 and the coarse winding portions 43 are alternately disposed along the X axis.

The dense winding portions 42 include a first dense winding portion 42A, a second dense winding portion 42B, a third dense winding portion 42C, and a fourth dense winding portion 42D in order from the positive X axis. The number of windings in each of the dense winding portions 42 is not particularly limited, for example, is preferably 2 or more and 40 or less, and is more preferably 4 or more and 10 or less. Further, the number of windings in each of the dense winding portions 42 may be the same or different. For example, in the present embodiment, the number of windings in the first dense winding portion 42A and the number of windings in the fourth dense winding portion 42D are the same 9, and the number of windings in the second dense winding portion 42B and the number of windings in the third dense winding portion 42C are the same 4. In this case, the coil 4 is called "Lee-Whiting4-Coil". Thereby, compared with a case where the coil 4 is, for example, a Helmholtz type coil, a size of the coil 4 can be reduced, and a region having uniform magnetic fields can be greatly expanded. Therefore, a region having nonuniform magnetic fields in the internal space S can be maintained at 2% or less.

The coarse winding portions 43 include a first coarse winding portion 43A, a second coarse winding portion 43B, and a third coarse winding portion 43C in order from the positive X axis. Sizes of the gaps 411 in the coarse winding portions 43 may be the same or different. For example, in the present embodiment, the size of the gap 411 in the first coarse winding portion 43A and the size of the gap 411 in the third coarse winding portion 43C are the same, and are larger than the size of the gap 411 in the second coarse winding portion 43B.

The number of the dense winding portions 42 is not limited to four, and the number of the coarse winding portions 43 is not limited to three.

A material of the coil 4 is not particularly limited. For example, a conductive metal material such copper or nickel-chrome alloy may be used.

In a case where nickel-chrome alloy is used as the material of the coil 4, the coil 4 generates heat by energization, and thus it is possible to heat the inside of the atom cell 3 via the support member 5. As described above, the coil 4 made of nickel-chrome alloy also functions as a heater for heating the atom cell 3. Thereby, the alkali metal atoms in the atom cell 3 can be heated, and at least some of the alkali metal atoms can be in a gas state with a desired concentration. Further, there is no need to provide, for example, a heater for heating the atom cell 3 separately from the coil 4, and thus it is possible to simplify the configuration of the atomic oscillator 1. The heater, in the present embodiment, the coil 4 is controlled by the control circuit 50.

The atomic oscillator 1 further includes the first shield member 6 that accommodates the atom cell 3, the support member 5, and the coil 4 and has a magnetic shielding property. Thereby, magnetic fields toward the atom cell 3 in a use environment of the atomic oscillator 1 can be shielded, and thus it is possible to reduce a fluctuation of the magnetic fields in the atom cell 3.

An insertion hole 61 is formed on the first shield member 6, the insertion hole 61 penetrating along the Y axis and through which the heat transfer member 7 is inserted.

Further, openings 62 and 63 penetrating along the X axis are formed in two walls of the first shield member 6, the walls facing each other on the X axis. The opening 62 is located on the negative X axis with respect to the opening 63, and the light beams LL passing through the opening 62 are incident on the first surface 311 of the atom cell 3. On the other hand, the opening 63 is located on the positive X axis with respect to the opening 62, and the light beams LL emitted from the second surface 312 pass through the opening 63.

A material of the first shield member 6 is not particularly limited. For example, an iron-based alloy having a relatively high magnetic permeability such as iron, kovar, permalloy, or stainless steel may be used.

The first shield member 6 may be a processed plate member with a single layer, or may be a processed plate member with a stacked body.

Further, in the insertion hole 61 of the first shield member 6, in a plan view with respect to the insertion hole 61, a portion of a first contact portion 73 that is disposed in the insertion hole 61 is large, and a gap 64 is formed between the insertion hole 61 and the first contact portion 73. The first contact portion 73 will be described later. A member made of the same material as that of the first shield member 6 may be fitted in the gap 64. Thereby, the gap 64 can be filled, and thus it is possible to prevent an inflow of the magnetic fields from the gap 64.

In the present embodiment, a gap is formed between the support member 5 and the first shield member 6, and the gap functions as a heat insulating layer 70 having a heat insulating property.

In this way, the atomic oscillator 1 includes the heat insulating layer 70 having a heat insulating property that is disposed between the support member 5, which supports the atom cell 3 on the inner side, and the first shield member 6 as a shield. Thereby, the heat generated by the coil 4 is unlikely to be released to the first shield member 6, that is, the heat is confined inside the heat insulating layer 70. Therefore, it is possible to quickly heat the atom cell 3. Further, it is possible to reduce a temperature change in the atom cell 3 after heating.

In the present embodiment, although the heat insulating layer 70 is formed by an air layer, the present disclosure is not limited to thereto. For example, the heat insulating layer 70 may be made of various heat insulating resin materials or ceramic materials having a low thermal conductivity such as steatite or zirconia. In addition, when the heat insulating layer 70 is formed by an air layer and it is difficult to ensure a heat insulating property due to an effect of convection in the heat insulating layer 70, the heat insulating layer 70 may be formed by various resin materials or ceramic materials. Further, when the heat insulating layer 70 is formed by various resin materials and ceramic materials, the heat insulating layer 70 is not formed at a portion on the optical path of the light beams LL. The heat insulating layer 70 may include a fiber, and may also be formed by a foam material and a porous material. Further, the heat insulating layer 70 may have a vacuum heat insulating structure for ensuring airtightness.

The second shield member 8 has a box shape, and the atom cell unit 20, the light-emitting element module 10, and the optical system unit 30 can be accommodated inside the second shield member 8. The second shield member 8 has a magnetic shielding property. Thereby, the magnetic field shielding property by the first shield member 6 can be supplemented, and thus it is possible to further reduce a fluctuation of the magnetic fields in the second shield member 8, particularly, in the atom cell 3 due to an influence of external magnetic fields.

A material of the second shield member 8 is not particularly limited. For example, the same material as the material of the first shield member 6 may be used.

Similar to the first shield member 6, the second shield member 8 may be a processed plate member with a single layer, or may be a processed plate member with a stacked body.

In the present embodiment, one shield member, that is, the first shield member 6 is disposed inside the second shield member 8. On the other hand, the number of shield members disposed inside the second shield member 8 is not limited to one. For example, a plurality of shield members may be disposed inside the second shield member 8. For example, when the number of shield members is two, the first shield member 6 and another shield member may be overlapped with each other, and the first shield member 6 may be accommodated in the other shield member.

The Peltier element 212 and the heat transfer member 7 are disposed between the second shield member 8 and the atom cell 3. The Peltier element 212 is located closer to the second shield member 8 with respect to the heat transfer member 7, and the heat transfer member 7 is in contact with a surface of the Peltier element 212 toward the atom cell 3. Further, the temperature sensor 204 is supported by and fixed to the heat transfer member 7.

As described above, the atomic oscillator 1 includes the Peltier element 212 as a temperature control element that is in contact with the heat transfer member 7 and controls the temperature in the atom cell 3. The Peltier element 212 has a heating function or a cooling function according to the direction of the supplied current, and thus it is possible to adjust the temperature in the atom cell 3 to a desired temperature via the heat transfer member 7.

Further, the Peltier element 212 is in contact with the second shield member 8 on a side opposite to the heat transfer member 7. Thereby, for example, when the Peltier element 212 cools the atom cell 3, surplus heat generated from the Peltier element 212 can be released via the second shield member 8.

Further, in the atomic oscillator 1, for example, when there is a shortage in amount of heat generated by the Peltier element 212, the shortage may be compensated by heat from another heater (not illustrated) disposed adjacent to the Peltier element 212. In this case, the heater is not particularly limited. For example, various heaters such as a ceramic heater or a power transistor may be used.

The heat transfer member 7 is a member that penetrates the support member 5 and the first shield member 6, is in contact with the atom cell 3 and the Peltier element 212, and has a thermal conductivity higher than a thermal conductivity of the trunk portion 33 of the atom cell 3. The heat transfer member 7 has a columnar shape, centers on an axis parallel to the Y axis, and includes a first contact portion 73 that is in contact with a portion of the third surface 313 of the atom cell 3 and a second contact portion that is in contact with the Peltier element 212. An outer diameter of the first contact portion 73 is smaller than an outer diameter of the second contact portion 74. The first contact portion 73 may be in direct contact with the atom cell 3, or may be in contact with the atom cell 3 via an adhesive or the like having a thermal conductivity. Similarly, the second contact portion 74 may be in direct contact with the Peltier element 212, or may be in contact with the Peltier element 212 via an adhesive or the like having a thermal conductivity.

The thermal conductivity of the heat transfer member 7 is preferably 1.1 times or more and 400 times or less, more preferably 10 times or more and 2000 times or less the thermal conductivity of the trunk portion 33 of the atom cell 3. Since the thermal conductivity of the heat transfer member 7 is higher than the thermal conductivity of the atom cell 3, heat transfer via the heat transfer member 7 can be efficiently performed. As a material of the heat transfer member 7, for example, when the trunk portion 33 is made of a glass material, a metal material such as copper or aluminum, graphite, or the like may be used.

The heat transfer member 7 is not limited to a member obtained by processing one base member. For example, the heat transfer member 7 may be formed by a connection body obtained by processing several base members and connecting the base members. In a case where a plurality of members are connected, all the members may be made of the same material, or at least one member may be made of a different material.

Further, the temperature sensor 204 is supported by and fixed to the second contact portion 74. The temperature sensor 204 is a temperature detection element that detects a temperature of the heat transfer member 7. The temperature sensor 204 is not particularly limited. For example, various temperature detection elements such as a thermistor or a thermocouple may be used. A position of the temperature sensor 204 is not limited to a position on the second contact portion 74. For example, as long as the temperature sensor 204 can appropriately control the temperature of the atom cell 3, the temperature sensor 204 may be disposed on another portion of the heat transfer member 7, the first shield member 6, or the second shield member 8.

As described above, in the atomic oscillator 1, the atom cell 3 is heated by the coil 4, and thus some of the alkali metal atoms accommodated in the atom cell 3 become a gas. In the atom cell 3, the supplementary metal MR is accommodated. The supplementary metal MR may be attached to a predetermined position such as the trunk portion 33 of the atom cell 3.

The atomic oscillator 1 controls a temperature of a portion of the atom cell 3 to a temperature lower than a temperature of the other portion of the atom cell 3 by the Peltier element 212 and the heat transfer member 7. The other portion of the atom cell 3 is heated by the coil 4 to a temperature higher than a temperature of the portion which is in contact with the heat transfer member 7. The Peltier element 212 may heat or cool the portion of the atom cell 3 via the heat transfer member 7.

By the control, a portion having a relatively high temperature and a portion having a relatively low temperature are formed in the inner wall surface and the internal space S of the atom cell 3. Since a saturated vapor pressure of the portion having a relatively low temperature is lower than a saturated vapor pressure of the portion having a relatively high temperature, the supplementary metal MR adheres to the inner wall surface of the portion having a relatively low temperature in a liquid state or a solid state. Thereby, the supplementary metal MR can be attached to a desired position of the atom cell 3, and thus it is possible to prevent the supplementary metal MR from moving in the internal space S and interfering with the light beams LL.

In the atomic oscillator 1, the heat transfer member 7 is in contact with the atom cell 3 via the opening of the first shield member 6. Thereby, even when a protruding portion is not provided in the atom cell 3, that is, even when the atom cell 3 having a simple shape is used as compared with a case where the atom cell including a protruding portion is used, it is possible to control a temperature of a portion of the atom cell 3 to a temperature different from a temperature of the other portion of the atom cell 3.

When the atom cell 3 has a simple shape, the first surface 311 as a surface on which the light beams are incident and the second surface 312 as a surface from which the light beams are emitted can also be made in a simple shape. Thereby, it is easy to ensure an area of the first surface 311 to such an extent sufficient for the light beams LL to enter the first surface 311 and to excite the alkali metal atoms. Alternatively, it is easy to ensure an area of the second surface 312 to such an extent sufficient for the light beams LL to be emitted from the second surface 312 and to be detected by the light-receiving element 202. Thereby, it is possible to improve an oscillation characteristic of the atomic oscillator 1, particularly, frequency stability.

In the heat transfer member 7, an area of the surface of the second contact portion 74 facing the Peltier element 212 may be close to an area of the surface of the Peltier element 212 facing the second contact portion 74. Further, the entire surface facing the Peltier element 212 may be in contact with the Peltier element 212. Thereby, it is possible to reduce a loss in heat transfer between the Peltier element 212 and the second contact portion 74.

As described above, the atom cell 3 accommodates the supplementary metal MR as the alkali metal atoms in a solid state or a liquid state. The supplementary metal MR is unevenly distributed toward the heat transfer member 7 in the atom cell 3. Thereby, in the atomic oscillator 1, it is possible to prevent the supplementary metal MR from moving in the internal space S and interfering with the light beams LL.

The heat transfer member 7 penetrates the heat insulating layer 70. Thereby, the portion of the heat transfer member 7, that is, the periphery of the portion penetrating through the heat insulating layer 70 is in a heat insulating state, and thus heat is unlikely to be released from the heat transfer member 7 as compared with a case where the heat insulating layer is not provided. Therefore, heat transfer by the heat transfer member 7 can be quickly performed.

The atom cell 3 is disposed inside the heat insulating layer 70. By providing the heat insulating layer 70, the atom cell 3 is unlikely to be influenced by a temperature outside the atom cell 3. Thus, as compared with a case where the heat insulating layer 70 is not provided, it is easy to stabilize the temperature of the atom cell 3 to a temperature by the Peltier element 212 or the coil 4.

As described above, the coil 4 includes the coarse winding portions 43 in which the gap 411 is formed between portions of the wire 41 adjacent to each other along the X axis, that is, the optical axis a of the light beams LL transmitting through the atom cell 3. The heat transfer member 7 is in contact with a portion of the atom cell 3 via the gap. In the present embodiment, the heat transfer member 7 is inserted through the coarse winding portion 43 which is located at the end of the three or more coarse winding portions 43, that is, the first coarse winding portion 43A.

Since the heat transfer member 7 is inserted through the coarse winding portion 43, the coil 4 and the heat transfer member 7 do not physically interfere with each other, and the atom cell 3 can be covered with the coil 4. For example, in a configuration in which two solenoid coils are disposed with a gap and the heat transfer member 7 is in contact with the atom cell 3 via the gap between the two solenoid coils, the magnetic fields in the atom cell 3 become nonuniform. On the other hand, the magnetic fields generated by the coil 4 including the coarse winding portions 43 are uniform in the atom cell 3. Thus, a magnetic field gradient is unlikely to occur. Therefore, it is possible to improve the frequency stability of the atomic oscillator 1.

In the present embodiment, although the heat transfer member 7 is inserted through the first coarse winding portion 43A among the three coarse winding portions 43, the present disclosure is not limited thereto. For example, the heat transfer member 7 may be inserted through the second coarse winding portion 43B or the third coarse winding portion 43C. In a case where the heat transfer member 7 is inserted through the first coarse winding portion 43A, the portion of the atom cell 3 having a relatively low temperature is a portion near the window portion 35 on the X axis. As compared with a case where the heat transfer member 7 is inserted through the third coarse winding portion 43C, the temperature of the window portion 34 is unlikely to be low, and thus the alkali metal atoms are unlikely to adhere to the window portion 34 on which the light beams LL are incident. For this reason, the intensity of the light beams LL incident on the atom cell 3 is unlikely to be weakened, and thus light shifting hardly occurs. Therefore, as compared with the case where the heat transfer member 7 is inserted through the third coarse winding portion 43C, it is possible to improve the frequency stability of the atomic oscillator 1.

As described above, an atomic oscillator 1 includes a light-emitting element 102 that emits light beams LL, an atom cell 3 that includes a first surface 311 on which the light beams LL from the light-emitting element 102 are incident and a second surface 312 from which the light beams LL incident on the first surface 311 are emitted and accommodates alkali metal atoms in a gas state, a first shield member 6 as a shield that accommodates the atom cell 3 and has a magnetic shielding property, a heat transfer member 7 that is in contact with a portion of the atom cell 3 via an opening of the first shield member 6 and has a thermal conductivity higher than a thermal conductivity of the atom cell 3, a Peltier element 212 as a temperature control element that is in contact with the heat transfer member 7 and controls a temperature of the atom cell 3, and a light-receiving element 202 that receives the light beams LL emitted from the second surface 312.

According to this configuration, as described above, even when the atomic oscillator 1 has a simple structure, it is possible to control a temperature of a portion of the atom cell 3 to a temperature different from a temperature of the other portion of the atom cell 3.

Further, the coil 4 appropriately covers the atom cell 3 from the outside of the atom cell 3 while avoiding the heat transfer member 7. Thereby, the magnetic fields generated by the coil 4 become uniform in the atom cell 3, and thus the alkali metal atoms can be stabilized at a desired energy level by Zeeman splitting. Therefore, it is possible to improve the frequency stability of the atomic oscillator 1. In addition, the coil 4 is a Lee-Whiting type coil, and thus it is possible to reduce a size of the entire atomic oscillator 1 including the coil 4. Further, in the atomic oscillator 1, the coil 4 has both of a magnetic field generation function and a heat generation function, and thus there is no need to provide each member having each function. Thereby, the number of components of the atomic oscillator 1 can be reduced, and thus it is possible to reduce a cost of the atomic oscillator 1.

Second Embodiment

Figure 3:
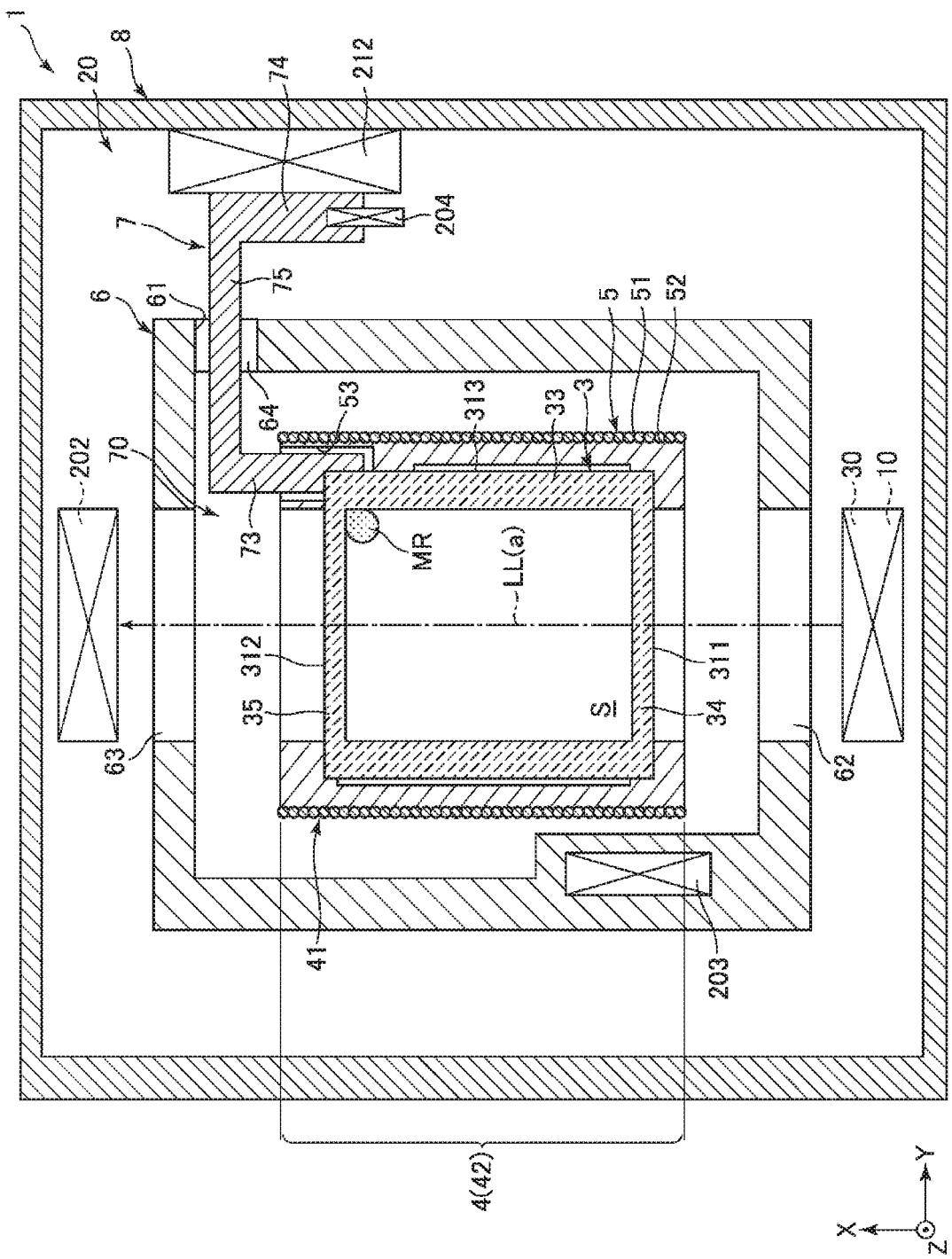
FIG. 3 is a sectional view of a main portion of an atomic oscillator according to a second embodiment.

FIG. 3 is a sectional view of a main portion of an atomic oscillator according to a second embodiment.

Hereinafter, an atomic oscillator and a frequency signal generation system according to a second embodiment will be described with reference to FIG. 3 focusing on a difference from the first embodiment. The same components are denoted by the same reference numerals, and a description thereof will be omitted.

As illustrated in FIG. 3, the heat transfer member 7 is bent, and includes a first contact portion 73 extending along the X axis, a second contact portion 74 extending along the X axis, and a connection portion 75 extending along the Y axis and connecting the first contact portion and the second contact portion 74. The connection portion 75 connects an end portion of the first contact portion 73 on the positive X axis and an end portion of the second contact portion 74 on the positive X axis.

In the heat transfer member 7, the first contact portion 73, the second contact portion 74, and the connection portion 75 are formed as one body. On the other hand, some of the portions may be formed as a separate body. For example, the second contact portion 74 and the connection portion 75 may be formed as one body, and the first contact portion 73 may be formed as a separate body. In this case, materials of the portions may be the same or different from each other.

Further, in the present embodiment, the coil 4 is a so-called solenoid coil including a dense winding portion 42.

The heat transfer member 7 is in contact with the atom cell 3 via an opening of the coil 4, in the present embodiment, via an opening of the coil 4 on the positive X axis, so as to avoid the coil 4, the coil 4 through which the light beams LL transmitting through the atom cell 3 pass. The heat transfer member 7 does not need to be inserted through the coil 4 on the Y axis, and thus the coil 4 may not include the coarse winding portion 43. Therefore, the configuration of the present embodiment is effective when the coil 4 including the dense winding portion 42 is used as a coil 4.

Further, in the present embodiment, the first contact portion 73 of the heat transfer member 7 is in contact with the second surface 312 and the third surface 313 of the atom cell 3. The first contact portion 73 may be in contact with only the second surface 312, or may be in contact with only the third surface 313 as long as the light beams LL and the supplementary metal MR do not interfere with each other.

In the present embodiment, the coil 4 includes the dense winding portion 42, and the present disclosure is not limited thereto. For example, the coil 4 may include the coarse winding portion 43.

The atomic oscillator 1 further includes a heater 203 that heats the atom cell 3. Thereby, for example, when there is a shortage in amount of heat generated by the coil 4, the shortage can be compensated by the heat from the heater 203. Further, for example, when copper is used as a material of the coil 4, heat generation by energization is suppressed in the coil 4. Therefore, when heating the inside of the atom cell 3, the heater 203 can be used instead of the coil 4.

In the present embodiment, the heater 203 is surrounded by the first shield member 6. Thereby, it is possible to reduce an influence on the magnetic fields of the atom cell 3 due to magnetic fields generated by energizing the heater 203. In the present embodiment, the heater 203 is disposed on a side opposite to the heat transfer member 7 with the atom cell 3 interposed therebetween. The disposition of the heaters 203 and the number of the heaters 203 are not limited thereto. By providing the heater 203 on a side opposite to the heat transfer member 7 with the atom cell 3 interposed therebetween, it is possible to easily stabilize a temperature gradient generated in the atom cell 3.

The heater 203 is not particularly limited. For example, various heaters such as a ceramic heater or a power transistor may be used.

Third Embodiment

Figure 4:
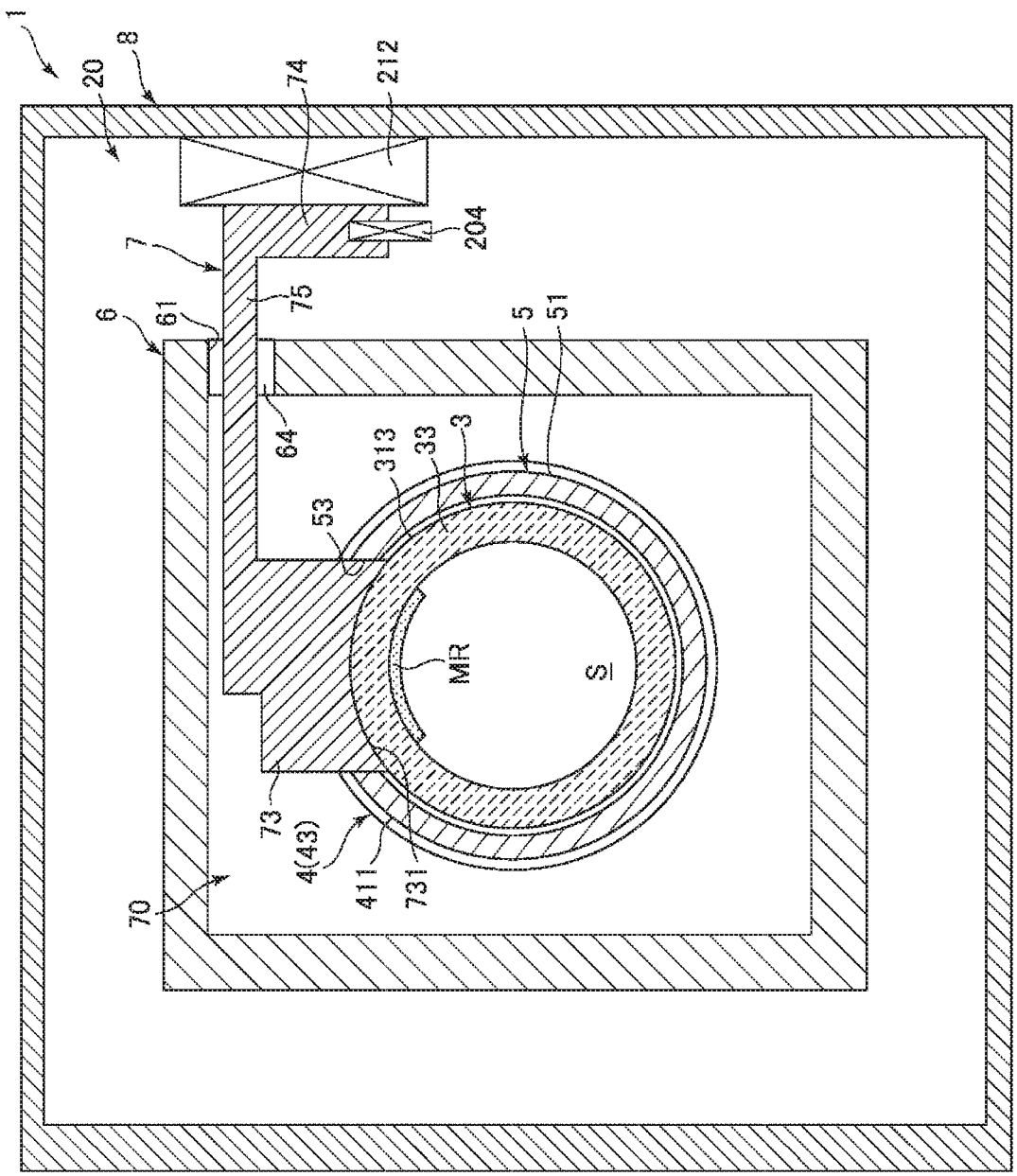
FIG. 4 is a sectional view of a main portion of an atomic oscillator according to a third embodiment.

FIG. 4 is a sectional view of a main portion of an atomic oscillator according to a third embodiment along an Y-Z plane.

Hereinafter, an atomic oscillator and a frequency signal generation system according to a third embodiment of the present disclosure will be described with reference to FIG. 4 focusing on a difference from the embodiments. A description of the same components will be omitted.

As illustrated in FIG. 4, in the heat transfer member 7, the first contact portion 73 is in contact with the atom cell 3 from the positive Z axis. Further, a surface 731 of the first contact portion 73 on the negative Z axis is in contact with the third surface 313 of the atom cell 3. The first contact portion 73 has a shape close to a cube, and the surface in contact with the atom cell 3 has a shape along the third surface 313.

Even in this configuration, the heat transfer member 7 is inserted through the coarse winding portion 43, and thus uniformity of the magnetic fields can be improved. Therefore, it is possible to improve frequency stability of the atomic oscillator 1.

Fourth Embodiment

Figure 5:
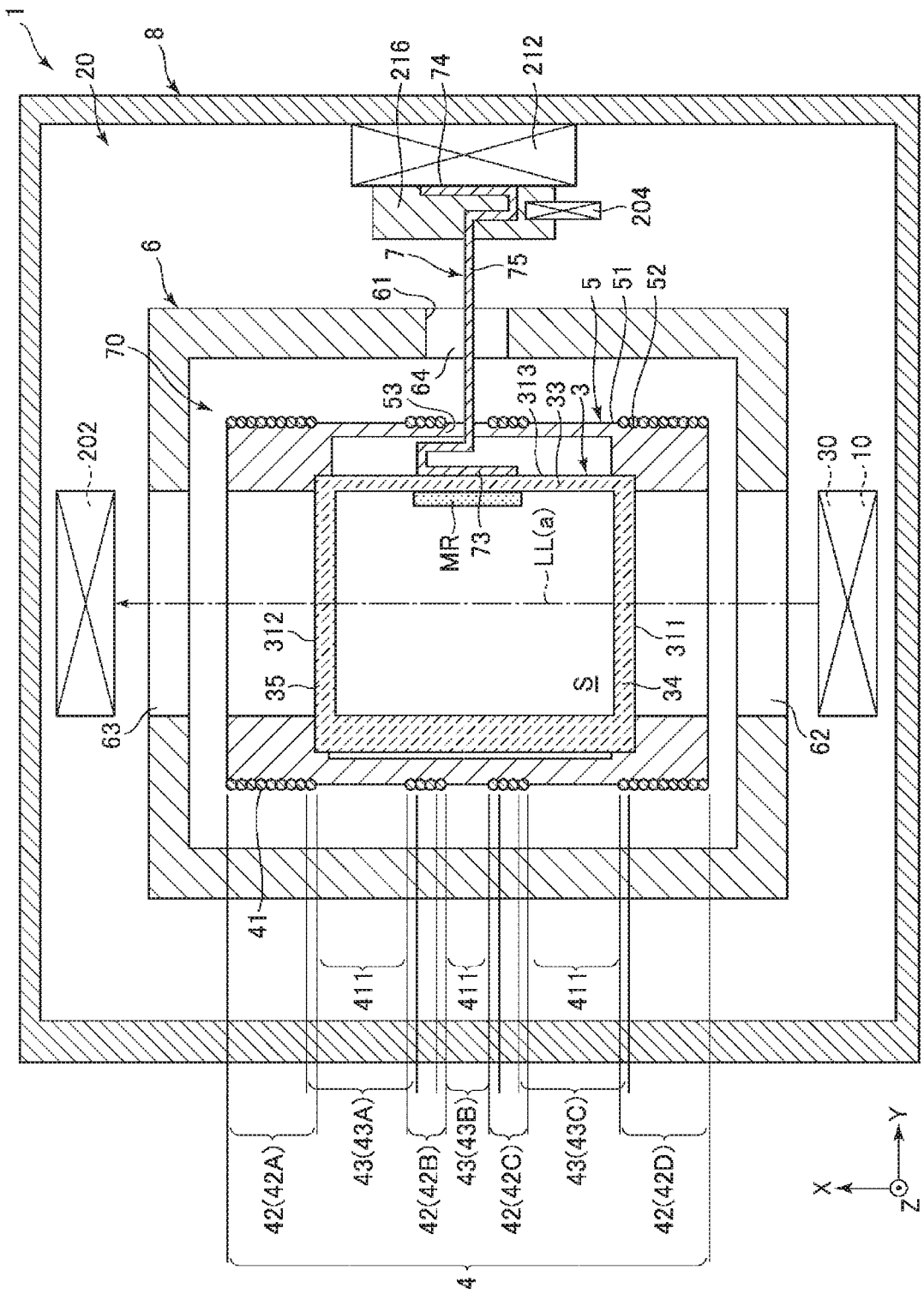
FIG. 5 is a sectional view of a main portion of an atomic oscillator according to a fourth embodiment.

FIG. 5 is a sectional view of a main portion of an atomic oscillator according to a fourth embodiment.

Hereinafter, an atomic oscillator and a frequency signal generation system according to a fourth embodiment of the present disclosure will be described with reference to FIG. 5 focusing on a difference from the embodiments. A description of the same components will be omitted.

As illustrated in FIG. 5, the heat transfer member 7 is formed by bending a plate member, and includes a first contact portion 73 extending along the X axis, a second contact portion 74 extending along the X axis, and a connection portion 75 connecting the first contact portion and the second contact portion 74. The connection portion 75 connects an end portion of the first contact portion 73 on the positive X axis and an end portion of the second contact portion 74 on the negative X axis. The heat transfer member 7 has elasticity so as to be expanded or contracted along the Y axis, that is, so as to vary a distance between the first contact portion 73 and the second contact portion 74 along the Y axis.

The heat transfer member 7 can be expanded or contracted along the Y axis, and thus the heat transfer member 7 can be pressed against the atom cell 3 and the Peltier element 212. Therefore, for example, even when there is a variation in distance between the atom cell 3 and the Peltier element 212 along the Y axis due to an individual difference of the atomic oscillator 1, the atom cell 3 and the Peltier element 212 can be thermally connected to each other via the heat transfer member 7. Thereby, for example, it is possible to reduce an individual difference in movement of heat between the atom cell 3 and the Peltier element 212.

Further, in the heat transfer member 7, the second contact portion 74 is fixed to the Peltier element 212 via a fixing member 216. Similarly to the heat transfer member 7, the fixing member 216 is also made of a material having an excellent thermal conductivity.

In the present embodiment, the heat transfer member 7 is inserted through the coarse winding portion 43 which is located at the center of the three coarse winding portions 43 of the coil 4, that is, the second coarse winding portion 43B. Thereby, it is possible to suppress an influence by a temperature on both of the window portion 34 and the window portion 35 of the atom cell 3. In addition, it is considered that symmetry of the magnetic fields is unlikely to be disturbed. Further, as compared with a case where the heat transfer member 7 is inserted through the first coarse winding portion 43A or the third coarse winding portion 43C, temperatures of the window portion 34 and the window portion 35 are unlikely to be low, and thus the alkali metal atoms are unlikely to adhere to the window portion 44 and the window portion 45. Therefore, light shifting is unlikely to occur, and an amount of light received by the light-receiving element is unlikely to decrease.

Fifth Embodiment

Figure 6:
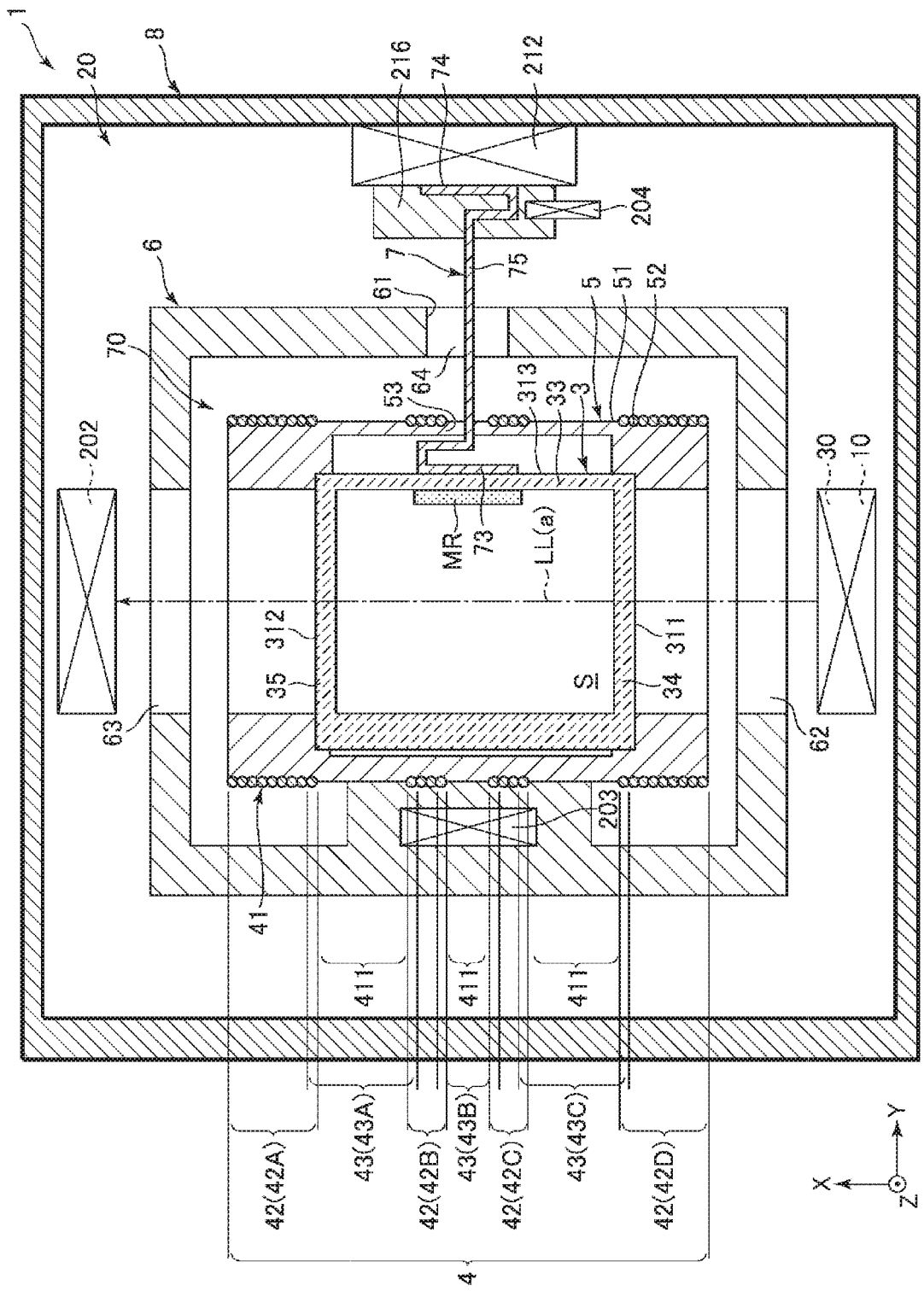
FIG. 6 is a sectional view of a main portion of an atomic oscillator according to a fifth embodiment.

FIG. 6 is a sectional view of a main portion of an atomic oscillator according to a fifth embodiment.

Hereinafter, an atomic oscillator according to a fifth embodiment of the present disclosure will be described with reference to FIG. 6 focusing on a difference from the embodiments. A description of the same components will be omitted.

As illustrated in FIG. 6, the heater 203 is surrounded by the first shield member 6. The first shield member 6 is in contact with the support member 5, and the heater 203 is thermally connected to the support member 5. Thereby, the heat of the heater 203 can be transmitted to the atom cell 3 via the support member 5, and thus it is possible to more quickly heat the atom cell 3, for example, as compared with a case where there is a gap between the heater 203 and the atom cell 3. A heat insulating member may be disposed between a surface of the heater 203, which is opposite to a surface facing the atom cell 3, and the first shield member 6. As compared with a case where a heat insulating member is not provided, the heat of the heater 203 is unlikely to be transmitted to a portion of the first shield member 6 that is not in contact with the atom cell 3, and thus it is possible to efficiently heat the atom cell 3.

Sixth Embodiment

Figure 7:
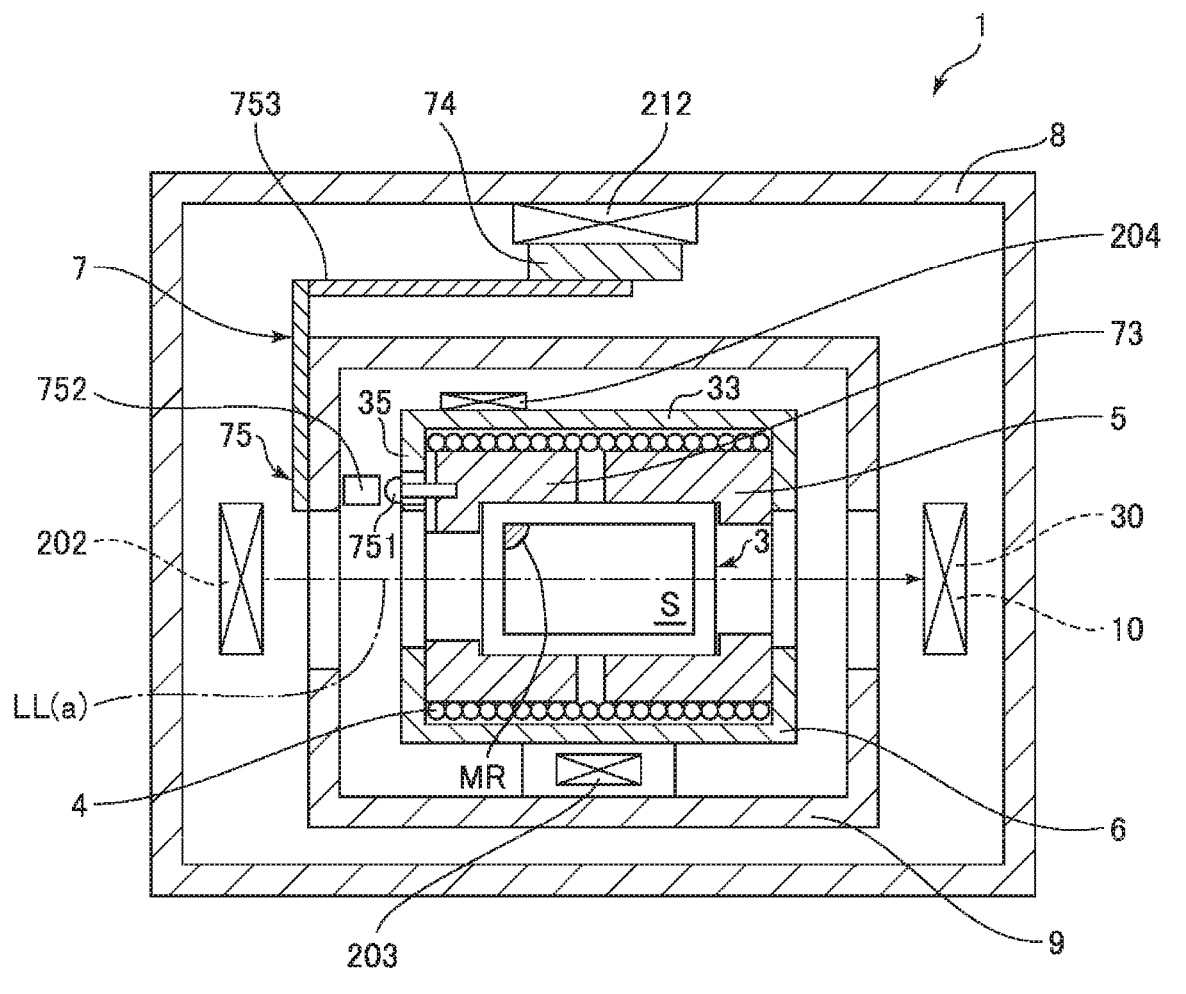
FIG. 7 is a sectional view of a main portion of an atomic oscillator according to a sixth embodiment.

FIG. 7 is a sectional view of a main portion of an atomic oscillator according to a sixth embodiment.

Hereinafter, an atomic oscillator and a frequency signal generation system according to a sixth embodiment will be described with reference to FIG. 7 focusing on a difference from the embodiments. The same components are denoted by the same reference numerals, and a description thereof will be omitted.

As illustrated in FIG. 7, the atomic oscillator 1 according to the present embodiment includes a third shield member 9 as a third shield that accommodates the first shield member 6. The third shield member 9 is accommodated in the second shield member 8.

The heat transfer member 7 is formed by a plurality of members, and the first contact portion 73 is in contact with the window portion 35 and the trunk portion 33 of the atom cell 3. The first contact portion 73 is disposed at a distance from the support member 5. There is a gap between the first contact portion 73 and the support member 5. Further, the first contact portion 73 is disposed at a distance from the first shield member 6. There is a gap between the first contact portion 73 and the first shield member 6.

The connection portion 75 includes a screw 751 that connects the first shield member 6 and the first contact portion 73, a metal plate 752 that connects the screw 751 and the third shield member 9, and a metal plate 753 that connects the third shield member 9 and the second contact portion 74. The screw 751 is connected to the first contact portion 73 via a screw hole of the first shield member 6, that is, an opening of the first shield member 6. The connection structure between members of the connection portion 75 is a structure in which the heat can be transmitted. In the present embodiment, the metal plate 752 is interposed between the screw 751 and the third shield member 9. A connection portion between the connection portion 75 and the second contact portion 74 may be adhered by an adhesive agent having a thermal conductivity, and a contact portion between the second contact portion 74 and the Peltier element 212 may be adhered by an adhesive agent having a thermal conductivity. Further, a portion of the third shield member 9 also contributes to the heat transfer between the two metal plates, and thus it can be said that the portion of the third shield member 9 is also included in the heat transfer member 7.

The temperature sensor 204 is disposed in the third shield member 9. A distance between the temperature sensor 204 and the first contact portion 73 is shorter than a distance between the temperature sensor 204 and the support member 5. Since the temperature sensor 204 is disposed in the third shield member 9, it is possible to detect a temperature closer to the actual temperature of the atom cell 3 as compared with a case where the temperature sensor 204 is disposed on the second contact portion.

The atomic oscillator 1 according to the present embodiment includes the third shield member 9, and thus it is possible to reduce an influence of external magnetic fields on the atom cell 3 as compared with a case where the third shield member 9 is not provided. The first contact portion 73 is disposed at a distance from the support member 5 and the first shield member 6. Although the first contact portion 73 and the first shield member 6 may be in contact with each other, since the first contact portion 73 is disposed at a distance from the first shield member 6, the heat from the heater 203 is unlikely to be transmitted to the first contact portion 73. Thus, the temperature of the portion of the atom cell 3 that is in contact with the contact portion 73 and the temperature from the heater 203 are unlikely to interfere with each other. A heat insulating material may be provided in a gap between the first contact portion 73 and the first shield member 6. Further, a heat insulating material may also be provided in the screw hole, and thus heat transfer between the screw 751 and the first shield member 6 may be reduced. In FIG. 7, although a portion of the connection portion 75 facing the third shield member 9 is in contact with the third shield member 9, a portion of the connection portion 75 may be separated from the third shield member 9.

Seventh Embodiment

Figure 8:
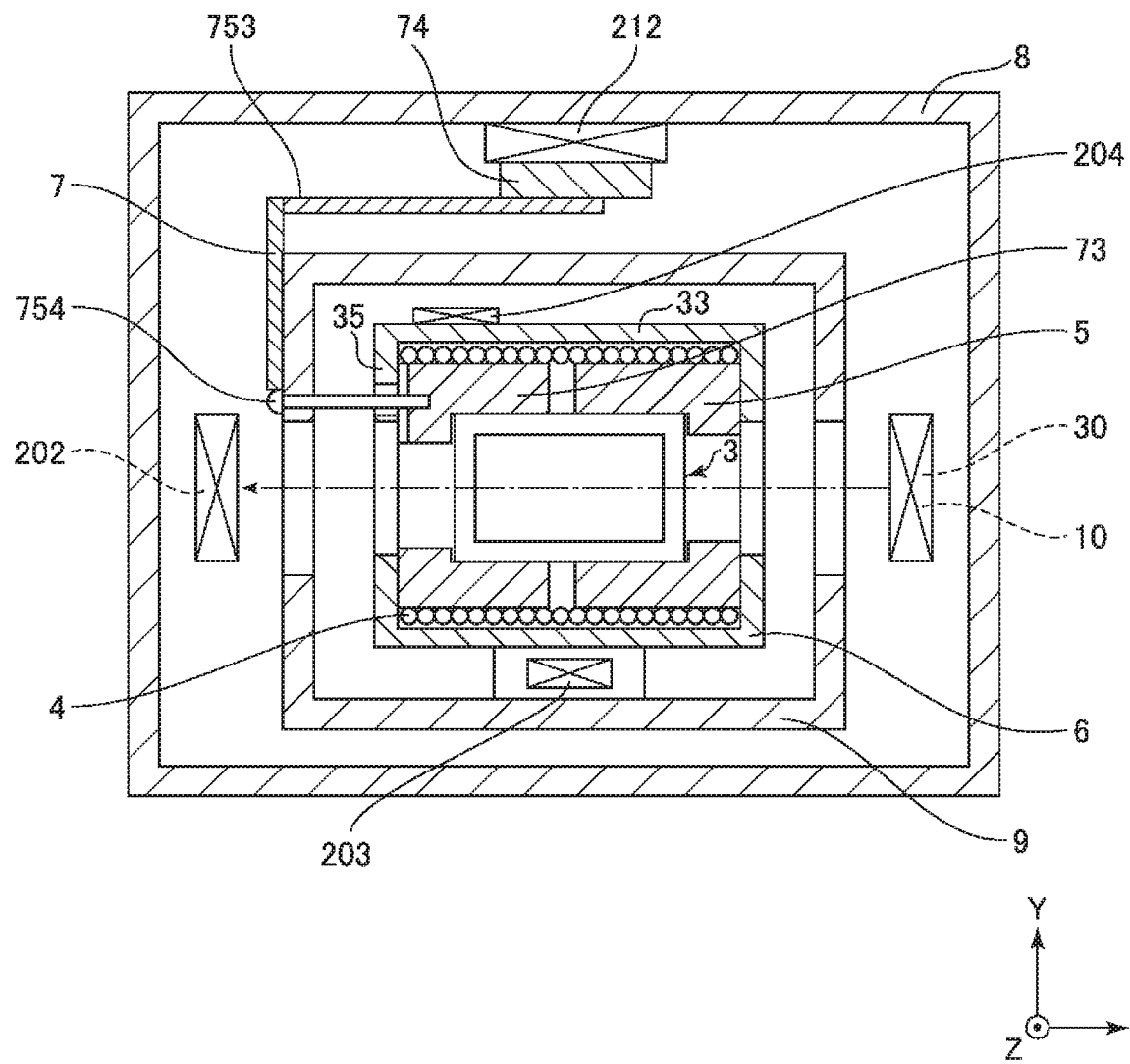
FIG. 8 is a sectional view of a main portion of an atomic oscillator according to a seventh embodiment.

FIG. 8 is a sectional view of a main portion of an atomic oscillator according to a seventh embodiment.

Hereinafter, an atomic oscillator and a frequency signal generation system according to a seventh embodiment will be described with reference to FIG. 8 focusing on a difference from the embodiments. The same components are denoted by the same reference numerals, and a description thereof will be omitted.

As illustrated in FIG. 8, the atomic oscillator 1 according to the present embodiment is different from the atomic oscillator according to the sixth embodiment in the structure of the heat transfer member 7. The connection portion 75 of the heat transfer member 7 includes a screw 754 connected to the first contact portion 73 via openings of the first shield member 6 and the third shield member 9. As compared with a case where the screw 751 and the third shield member 9 are connected by the metal plate 752 as illustrated in FIG. 7, the number of components can be reduced, and thus thermal resistance can be reduced. Therefore, heat transfer can be efficiently performed between the Peltier element 212 and the atom cell 3. Application Example of Atomic Oscillator The above-described atomic oscillator 1 may be incorporated in various frequency signal generation systems. Hereinafter, an embodiment of such a frequency signal generation system will be described.

Figure 9:
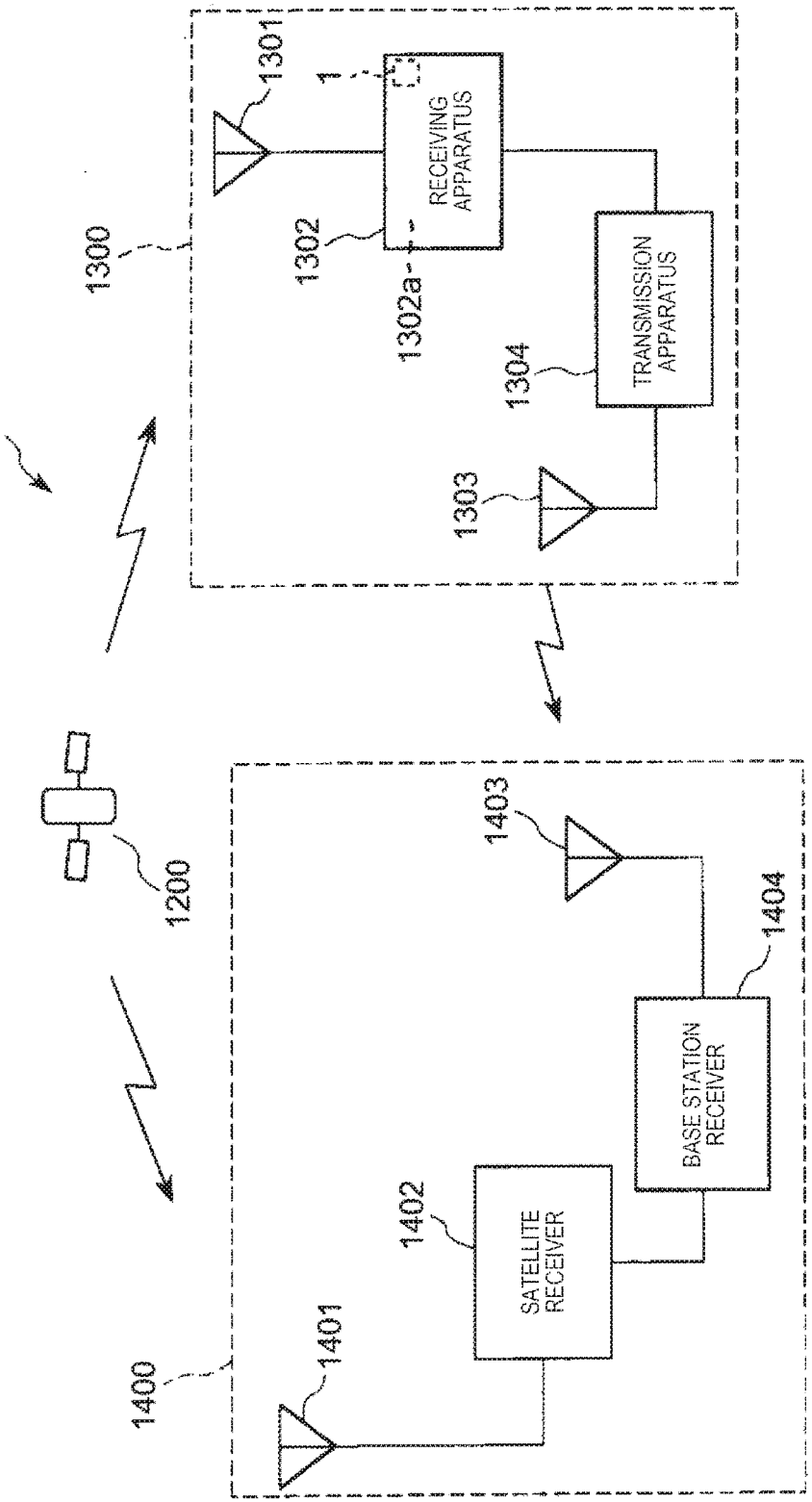
FIG. 9 is a diagram illustrating a schematic configuration of an example of a frequency signal generation system using a global positioning system (GPS) satellite.

FIG. 9 is a diagram illustrating a schematic configuration of an example of a frequency signal generation system using a global positioning system (GPS) satellite.

A positioning system 1100 illustrated in FIG. 9 includes a base station apparatus 1300 and a GPS receiving apparatus 1400. Here, an electronic apparatus including the atomic oscillator 1 may also be called a frequency signal generation system, and each of various systems configured with a plurality of electronic apparatuses including the atomic oscillator 1 may also be called a frequency signal generation system.

A GPS satellite 1200 transmits a satellite signal (GPS signal) including positioning information. The base station apparatus 1300 includes, for example, a receiving apparatus 1302 that receives the satellite signal from the GPS satellite 1200 via an antenna 1301 provided in a GPS continuous observation station as an electronic reference point, and a transmission apparatus 1304 that transmits the positioning information acquired from the satellite signal received by the receiving apparatus 1302 via an antenna 1303.

Here, the receiving apparatus 1302 includes an atomic oscillator 1 as a reference frequency oscillation source, and a processor 1302a that processes a frequency signal from the atomic oscillator 1. In addition, the positioning information acquired by the receiving apparatus 1302 is transmitted by the transmission apparatus 1304 in real time.

As described above, the receiving apparatus 1302 as a frequency signal generation system includes the atomic oscillator 1. According to the receiving apparatus 1302, a temperature gradient around the atom cell 3 of the atomic oscillator 1 can be reduced, and thus it is possible to improve characteristics of the receiving apparatus 1302. Further, the receiving apparatus 1302 is included in the positioning system 1100, and thus it is possible to improve characteristics of the positioning system 1100 as another example of a frequency signal generation system.

The GPS receiving apparatus 1400 includes a satellite receiver 1402 that receives positioning information from the GPS satellite 1200 via an antenna 1401, and a base station receiver 1404 that receives positioning information from the base station apparatus 1300 via an antenna 1403.

As described above, the positioning system 1100 and the receiving apparatus 1302 as examples of a frequency signal generation system include the atomic oscillator 1 and the processor 1302a that processes a frequency signal from the atomic oscillator 1. The atomic oscillator 1 includes a light-emitting element 102 that emits light beams LL, an atom cell 3 that includes a first surface 311 on which the light beams LL from the light-emitting element 102 are incident and a second surface 312 from which the light beams LL incident on the first surface 311 are emitted and accommodates alkali metal atoms in a gas state, a first shield member 6 as a shield that accommodates the atom cell 3 and has a magnetic shielding property, a heat transfer member 7 that is in contact with a portion of the atom cell 3 via an opening of the first shield member 6 and has a thermal conductivity higher than a thermal conductivity of the atom cell 3, a Peltier element 212 as a temperature control element that is in contact with the heat transfer member 7 and controls a temperature of the atom cell 3, and a light-receiving element 202 that receives the light beams LL emitted from the second surface 312.

According to such an aspect, it is possible to improve characteristics of the positioning system 1100 and the receiving apparatus 1302 by using advantages of the atomic oscillator 1.

The frequency signal generation system is not limited thereto, and may be any system including an atomic oscillator 1 and a processor that processes a frequency signal from the atomic oscillator 1. For example, the frequency signal generation system may be applied to a smart phone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation device, a pager, an electronic organizer (having a communication function), an electronic dictionary, a calculator, an electronic game device, a word processor, a work station, a video phone, a security TV monitor, an electronic binoculars, a point of sales (POS) terminal, a medical device (for example, an electronic thermometer, a blood pressure meter, a blood sugar meter, an electrocardiogram measuring device, a ultrasound diagnosis device, or an electronic endoscope), a fish finder, various measuring devices, instruments (for example, instruments for a vehicle, an aircraft, or a ship), a flight simulator, terrestrial digital broadcasting, a mobile phone base station, or the like. Further, the frequency signal generation system configured with a plurality of electronic apparatuses is not limited thereto as long as the frequency signal generation system is a system that generates a signal by processing the signal from the atomic oscillator 1. For example, the frequency signal generation system may be a clock transmission system or the like.

As described above, although the atomic oscillator and the frequency signal generation system according to the present disclosure have been described based on the embodiments illustrated in the drawings, the present disclosure is not limited thereto. Each component of the atomic oscillator and the frequency signal generation system may be replaced with any component having the same function. In addition, any component may be added.

Further, the atomic oscillator and the frequency signal generation system according to the present disclosure may be obtained by combining any two or more configurations and features of the embodiments.

In each of the embodiments, although the case where the present disclosure is applied to an atomic oscillator using a quantum interference effect has been described as an example, the present disclosure is not limited thereto. The present disclosure may be applied to an atomic oscillator using a double resonance phenomenon. In this case, the light source is not limited to a semiconductor laser, and for example, a light emitting diode, a lamp filled with alkali metal atoms, or the like may be used.

What is claimed is:

1. An atomic oscillator comprising:
   a light-emitting element;
   an atom cell that includes a first surface on which light beams from the light-emitting element are incident and a second surface from which the light beams incident on the first surface are emitted and accommodates alkali metal atoms in a gas state;
   a shield that accommodates the atom cell and has a magnetic shielding property, the shield having an opening;
   a heat transfer member that is in contact with a portion of the atom cell via the opening and has a thermal conductivity higher than a thermal conductivity of the atom cell;
   a temperature control element that is in contact with the heat transfer member and controls a temperature of the atom cell; and
   a light-receiving element that receives the light beams emitted from the second surface.

2. The atomic oscillator according to claim 1, further comprising:
   a heat insulating layer that is disposed between the atom cell and the shield and has a thermal conductivity lower than a thermal conductivity of the atom cell.

3. The atomic oscillator according to claim 2, wherein the heat transfer member penetrates the heat insulating layer.

4. The atomic oscillator according to claim 1, further comprising:
   a coil that is disposed outside the atom cell, is formed by a spirally-wound wire, and generates magnetic fields by energization.

5. The atomic oscillator according to claim 4, wherein the coil heats the atom cell by generating heat by the energization.

6. The atomic oscillator according to claim 4, further comprising:
   a heater that heats the atom cell.

7. The atomic oscillator according to claim 4, wherein the coil includes a coarse winding portion in which a gap is formed between portions of the wire adjacent to each other along an optical axis of the light beams transmitting through the atom cell, and
   the heat transfer member is in contact with a portion of the atom cell via the gap.

8. The atomic oscillator according to claim 4,
   the coil having an opening through which the light beams pass,
   wherein the heat transfer member is in contact with the atom cell via the opening.

9. The atomic oscillator according to claim 1, wherein the atom cell accommodates alkali metal atoms in a solid state or a liquid state, and
   the alkali metal atoms in a solid state or a liquid state are unevenly distributed toward the heat transfer member in the atom cell.

10. A frequency signal generation system comprising:
    an atomic oscillator; and
    a processor that processes a frequency signal from the atomic oscillator, wherein
    the atomic oscillator includes
      a light-emitting element,
      an atom cell that includes a first surface on which light beams from the light-emitting element are incident and a second surface from which the light beams incident on the first surface are emitted and accommodates alkali metal atoms in a gas state,
      a shield that accommodates the atom cell and has a magnetic shielding property, the shield having an opening,
      a heat transfer member that is in contact with a portion of the atom cell via the opening and has a thermal conductivity higher than a thermal conductivity of the atom cell,
      a temperature control element that is in contact with the heat transfer member and controls a temperature of the atom cell, and
      a light-receiving element that receives the light beams emitted from the second surface.

* * * * *